United States Patent
Wang et al.

(10) Patent No.: US 7,348,106 B2
(45) Date of Patent: Mar. 25, 2008

(54) METHOD FOR REPAIRING A PHASE SHIFT MASK

(75) Inventors: Hung-Chun Wang, Taichung county (TW); Ming-Chih Hsieh, Chu-Pei (TW); Han-Lin Wu, Banciao (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 686 days.

(21) Appl. No.: 10/841,186

(22) Filed: May 7, 2004

(65) Prior Publication Data

US 2005/0247669 A1    Nov. 10, 2005

(51) Int. Cl.
*G03F 1/00*    (2006.01)
*G03C 5/00*    (2006.01)

(52) U.S. Cl. ............................................. 430/5; 430/30

(58) Field of Classification Search .................... 430/5, 430/30, 296; 204/192.2, 192.3
See application file for complete search history.

(56) References Cited

U.S. PATENT DOCUMENTS

| | | | | |
|---|---|---|---|---|
| 5,830,607 A | * | 11/1998 | Isao et al. | 430/5 |
| 6,319,637 B1 | * | 11/2001 | Higashikawa et al. | 430/5 |
| 6,335,129 B1 | * | 1/2002 | Asano et al. | 430/5 |

* cited by examiner

*Primary Examiner*—S. Rosasco
(74) *Attorney, Agent, or Firm*—Duane Morris LLP

(57) ABSTRACT

A method is disclosed for repairing an attenuated phase shift mask. The mask initially has a mask substrate coated with a predetermined shift layer material, a mask pattern layer, and an energy beam resist layer sequentially. After forming a predetermined mask pattern in the mask pattern layer through an energy beam resist layer, the mask is inspected for detecting at least one missing pattern in the mask pattern layer. The predetermined mask pattern is repaired in a predetermined defect area for correcting the missing pattern. After the missing pattern is reformed. The predetermined mask pattern is transferred in the shift layer material.

20 Claims, 4 Drawing Sheets

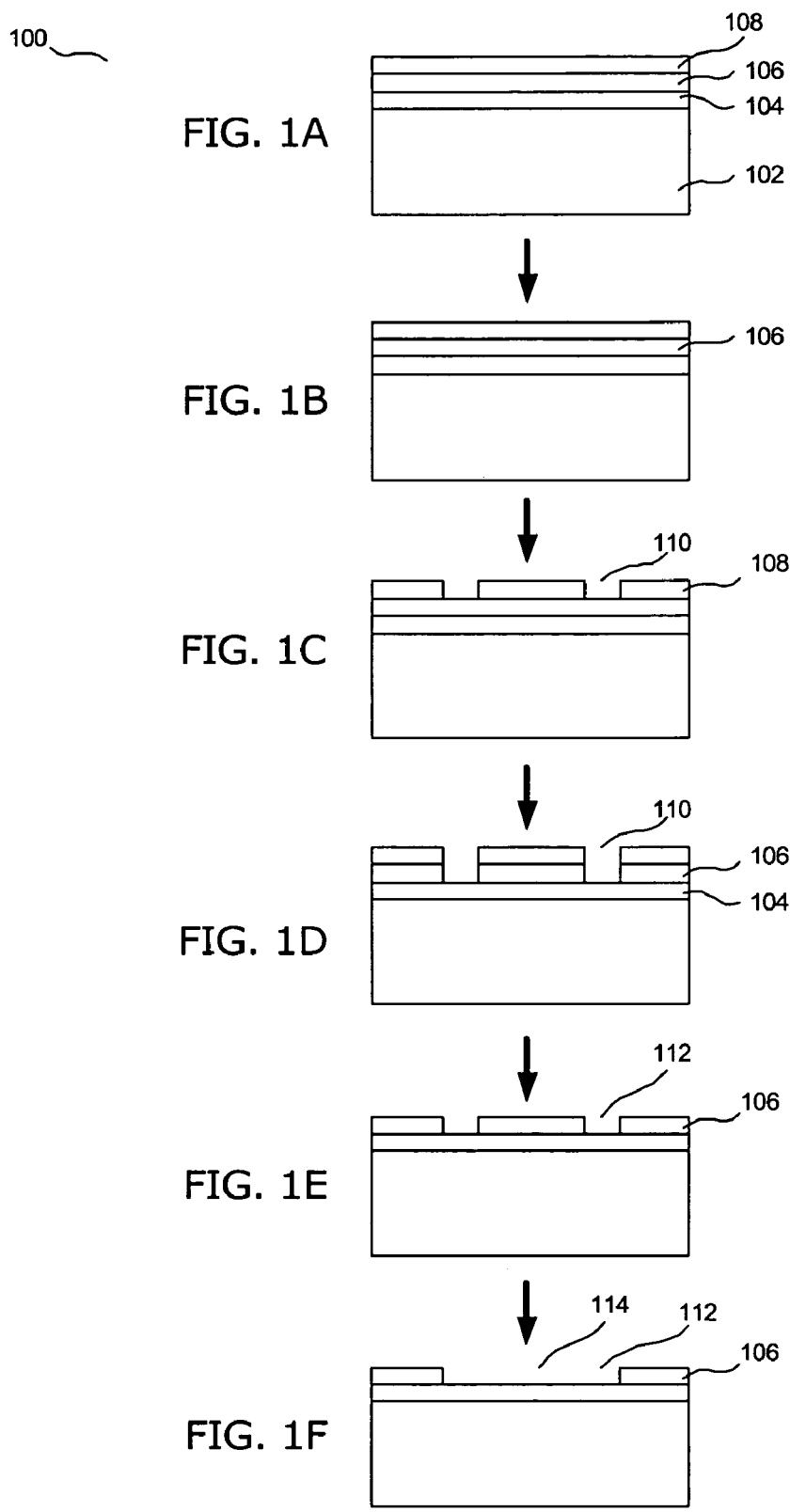

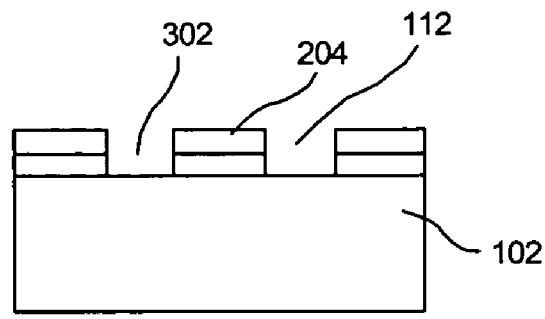
FIG. 3A
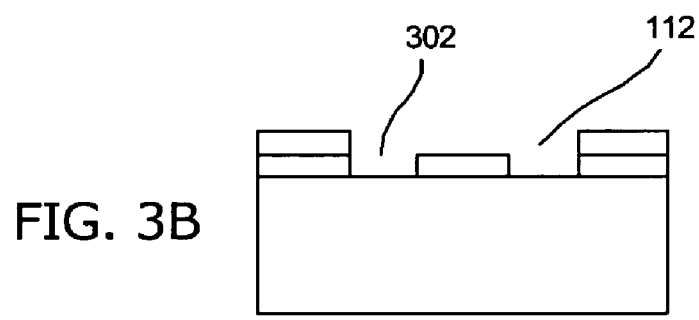
FIG. 3B
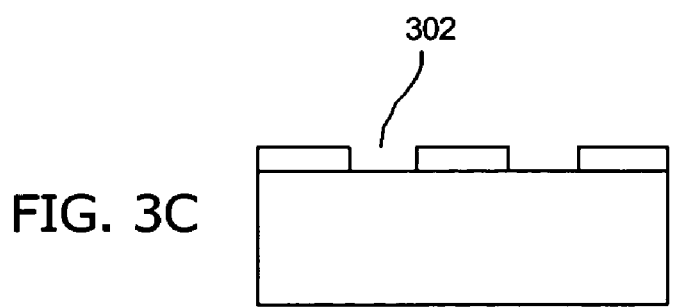
FIG. 3C

METHOD FOR REPAIRING A PHASE SHIFT MASK

BACKGROUND

The present invention relates generally to photolithography masks, and more particularly to attenuated phase shift masks. Still more particularly, the present invention relates to methods for repairing defects in an attenuated phase shift mask.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as, priming, resist coating, and soft bake. After exposure, the substrate may be subjected to other procedures, such as a post-exposure bake (PEB), development, a hard bake, and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each layer. Eventually, an array of devices will be present on the substrate (wafer). These devices are then separated from one another by a technique such as dicing or sawing, whence the individual devices can be mounted on a carrier, connected to pins, etc.

The basic lithography system consists of a light source, a stencil or photomask containing the pattern to be transferred to the wafer, a collection of lenses, and a means for aligning existing patterns on the wafer with patterns on the mask. Conventional photomasks consists of chromium (Cr) patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which, in common applications, allow a developer to dissolve and remove the resist in the exposed areas. Such resist materials are known as positive resists. (Negative resist systems allow only unexposed resist to be developed away.) The photomasks, when illuminated, can be pictured as an array of individual, infinitely small light sources which can be either turned on (points in clear areas) or turned off (points covered by chrome). If the amplitude of the electric vector which describes the light radiated by these individual light sources is mapped across a cross section of the mask, a step function will be plotted reflecting the two possible states in which each point on the mask can be found (light on, light off).

The quality with which small images can be replicated in lithography depends largely on the available process window. That is, the amount of allowable dose and focus variation that still results in correct image size. Phase shifted mask (PSM) lithography improves the lithographic process window or allows operation at a lower k value by introducing an additional parameter on the mask, i.e., an electric vector. The electric vector, like any vector quantity, has a magnitude and direction, so, in addition to turning the electric field amplitude on and off, it can be turned on with a phase of about 0 degree or turned on with a phase of about 180 degree. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude but point in exactly the opposite direction so that any interaction between these light beams result in perfect cancellation.

In recent years, the phase shift mask (PSM) has been gradually accepted by the industry as a viable alternative for sub-exposure-wavelength manufacturing. Two fundamental forms of PSM have been used the most, namely alternating PSM (altPSM) and attenuated PSM (attPSM). In the attenuated phase shift mask, the surface is mainly divided into two regions, which are the wholly transparent region in 0 degree phase and the attenuated transparent region in 180 degree phase. The wholly transparent region is mainly constructed of quartz, and the attenuated transparent region has an extra molybdenum silicide (MoSi), or similar material, layer. The transparency of the wholly transparent region is close to 100%. The transparency of the attenuated transparent region is much less than that of the wholly transparent region, and is typically less than 10%, possibly about 4 to 6%. The light that arrives at the photoresist on a wafer through the wholly transparent region of the photomask is 180 degrees out of phase with light that arrives at the photoresist on the wafer through the attenuated transparent region of the photomask. Where the two pattern regions appear adjacently, the phase difference produces destructive interference. The contrast between the wholly transparent region and the attenuated transparent region can be more pronounced, so that the resolution of the exposure process can be improved.

Several types of defects are possible in the production process for attPSM. There may have been defects in the original Cr coating, defects in the original resist coating, particles on the resist coating, Cr peeling, or electron-beam (or laser beam) writing errors. All these possible problems may show up in the delineated Cr pattern and therefore, in the delineated mask pattern. Accordingly, there remains a need for a repair process that can restore the designed pattern.

SUMMARY

In view of the foregoing, the present invention provides a method that can restore the designed pattern on a photomask such as an attenuated phase shift photomask.

The mask initially has a mask substrate coated with a predetermined shift layer material, a mask pattern layer, and an energy beam resist layer sequentially. In one example, after forming a predetermined mask pattern in the mask pattern layer through an energy beam resist layer, the mask is inspected for detecting at least one missing pattern in the mask pattern layer. The predetermined mask pattern is repaired in a predetermined defect area for correcting the missing pattern. After the missing pattern is reformed. The predetermined mask pattern is transferred in the shift layer material.

These and other aspects and advantages will become apparent from the following detailed description, taken in conjunction with the accompanying drawings, illustrating by way of example the principles of the disclosure.

BRIEF DESCRIPTION OF THE DRAWINGS

FIGS. 1A-1F illustrate a normal attPSM production process up through inspection.

FIGS. 3A-3C illustrate a completion of the normal attPSM production process after inspection and repair in accordance with one example of the present invention.

DESCRIPTION

Figure 2A:
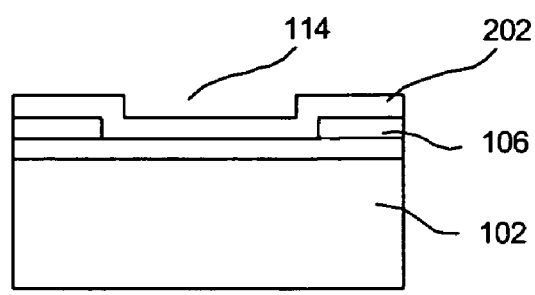
FIGS. 2A-2C illustrate a process for repair in accordance with one example of the present invention.

The present invention provides an improved method for repairing an attenuated phase shift mask (attPSM). Such a mask is utilized as a photomask in the production of semiconductor chip devices. In one example, production of an attPSM begins with a quartz plate coated first with a shift layer material such as molybdenum silicide (MoSi), second with a layer of chromium (Cr), and third with a layer of electron or laser beam resist. An electron beam or laser beam pattern-writing machine generates a primary pattern. The electron or laser beam, or any other similar beams, can be referred to as an energy beam for the purpose of this disclosure. The developed pattern defines the Cr etch, which defines the MoSi etch. There is a need for an inspection and pattern repair sequence to assure a correct pattern for MoSi etch.

In FIGS. 1A-1E, a process flow 100 illustrates normal attPSM production through inspection. FIG. 1A illustrates a typical process flow for the production of attPSM beginning with a blank quartz plate 102, that is first coated with a shift layer material such as molybdenum silicide (MoSi) 104, second coated with a mask pattern layer of chromium (Cr) 106, and third coated with a layer of electron or laser beam resist 108. This is the beginning of a process sequence that will produce a photomask that will be used to expose, with light, a design layer of an integrated circuit pattern into a photoresist coating on a semiconductor wafer. That photoresist pattern will contain many pattern elements that are sub-micron in size, in fact, smaller than the wavelength of the light used to expose the pattern in the photoresist. The generation of the primary pattern on the photomask is by a pattern-writing machine such as an electron-beam or laser-beam pattern-writing machine, which can generate, or write, pattern elements that are considerably smaller and more precisely defined than can be produced with a light exposure machine.

The second step in the production of an attPSM, as illustrated in FIG. 1B, is the exposure, or pattern writing, of the resist 108 by an energy beam such as an electron beam or laser beam. The resist 108 may be either positive-acting or negative-acting. The third step, as illustrated in FIG. 1C, is the development of the written pattern 110 in the resist 108. The fourth step, as illustrated in FIG. 1D, is the etching of the Cr layer 106, down to the shift material layer 104, using the developed resist pattern 110 as an etch resistant layer. The fifth step, as illustrated in FIG. 1E, is the stripping step for the resist. Now the resist pattern 110 is delineated in the Cr layer pattern 112.

At this point, several types of defects may become apparent. There may have been defects in the original Cr coating, defects in the original resist coating, particles on the resist coating, Cr peeling, or beam writing errors. All these possible problems may show up in the delineated Cr pattern.

Now the invention makes recovery from such problems possible. Recovery, as illustrated in FIG. 1F, begins with an inspection by an automatic machine, which compares the delineated Cr pattern 112 in the Cr layer 106, containing possible defects 114, with the original computer program from which it was generated or with a previously generated photomask pattern 110 shown in FIG. 1C. This inspection requires a decision. If the decision is made that the attPSM is correctly patterned, then it is moved to MoSi etch, as illustrated in FIG. 3A. If the decision is made that the attPSM is not patterned correctly, then it is moved to have the resist recoated, as illustrated in FIG. 2A. The locations of any defects 114 are recorded. The defect location data is sent to the pattern-writing machine.

Figure 2B:
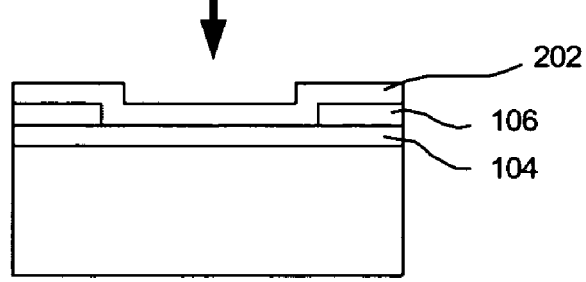
Figure 2C:
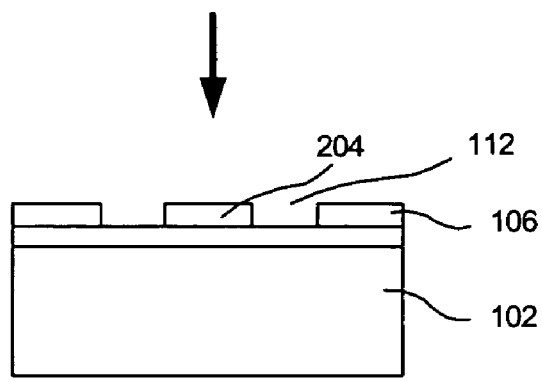
Figure 4:
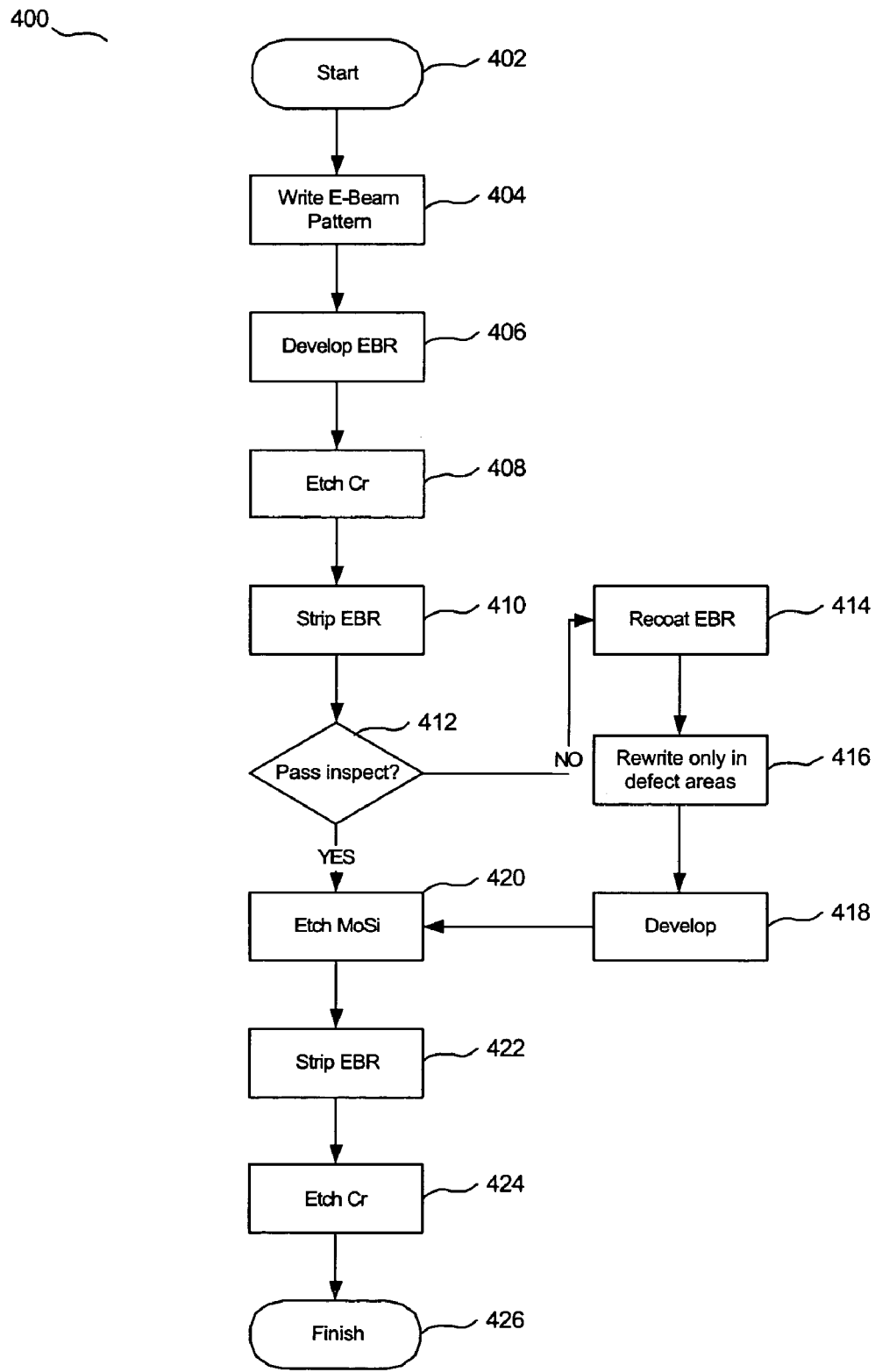
FIG. 4 illustrates a flow chart for attPSM production in accordance with one example of the present invention.

In FIGS. 2A-2C, a process flow 200 illustrates a repair process of the invention. FIG. 2A illustrates the photomask 102, with the Cr 106 defects 114, sent to be coated with a new layer of resist 202, which is a repair resist formed in a predetermined area for correcting the defect. This time, the resist 202 is typically negative-acting, for example. In FIG. 2B, the photomask 102, recoated, with negative resist 202, is sent to the pattern-writing machine, where only the specific areas containing defects are again exposed by the electron beam or laser beam. Pattern writing with an electron beam or laser beam is time consuming, but rewriting only the pattern areas that were previously defective only requires a small amount of time, since the area involved is a miniscule portion of the total area. This is the reason that negative-acting resist is preferable. In FIG. 2B, the electron beam or laser beam exposes or rewrites only those areas so as to repeat the pattern 110, as shown in FIG. 1C, that was intended to be produced by the first process sequence. The pattern-writing parameters are slightly different from those of the pattern-writing in the normal process flow because there is not a complete continuous layer of Cr 106 on the MoSi 104, so the conductive layers Cr 106 and MoSi 104 on the photomask 102 are slightly more resistive and they conduct the beam current away less efficiently. The parameters of the energy beam may be adjusted slightly. FIG. 2C illustrates a develop step, only in the locations that contained defects 114 the first time. Those locations now contain resist patterns 204 to redefine resist protection areas. At this point, the invention has reestablished a complete mask pattern, mostly defined in Cr pattern 112 in Cr layer 106, and partly defined in the new resist pattern 204. Now, the photomask 102 is returned to the normal process flow.

The next step in the normal process flow is MoSi 104 etch as illustrated in FIG. 3A. Most of the pattern is protected from this etch by the Cr pattern 112. The patterns in the previously defective areas 114 are protected from this etch by the new negative-acting resist patterns 204. In the normal process flow, there is no resist on the photomask 102 at this point. The miniscule total area of resist 204 in the repaired locations is tolerable. After the MoSi 104 etch, the resist pattern 204 along with the possibly defective Cr pattern 112, fully repairs and reestablishes the intended pattern 110 of the original resist layer 108. That originally intended pattern 110 is successfully delineated in the MoSi layer pattern 302. Then, as illustrated in FIG. 3B, the resist pattern 204 is stripped. The possibly defective Cr layer pattern 112 and the corrected MoSi layer pattern 302 remain. Then, as illustrated in FIG. 3C, the Cr is stripped, leaving only the intended MoSi pattern 302.

The excursion from the normal process flow (represented by FIGS. 2A-2C) for the purpose of pattern inspection and repair may requires a minimum of extra process steps, and a minimum of extra time in the pattern-writing machine, after the necessary inspection step.

A flow chart 400 illustrates an attPSM production process flow. The start of a quartz plate with coatings of MoSi, Cr, and resist is done in step 402. In step 404, a pattern-writing machine generates a primary pattern in resist. A development of the resist layer is carried out in step 406. And in step 408, an etching of the Cr layer is completed using an resist pattern as a mask. After a stripping of an resist layer (step 410), an inspection 412 is conducted. If the automated inspection shows a pattern defined in Cr to be defect-free, then an attPSM can be moved to an etching of MoSi step 420. However, if the inspection shows that pattern defects are present in a pattern defined in Cr, then the attPSM enters a repair sequence. Step 414 illustrates a recoating of resist in a localized area to begin a repair sequence. Step 416 illustrates a rewriting of a repair pattern, which is a part of the originally desired primary pattern, in areas containing identified defects. Step 418 illustrates a development of the rewritten resist. Now the repair sequence ends with the return of a repaired attPSM to the normal production process flow to MoSi etching step 420. This is the same process that is entered by an attPSM that inspection finds to be defect-free. After stripping of the resist after etch (step 422), step 424 performs an etching of Cr to leave a final desired pattern delineated in the MoSi layer. At this point, the production flow 400 is finished (step 426), and a repaired attPSM is produced that is composed of a quartz plate with an appropriate shift material layer that is free of a large class of production defects.

As illustrated above, the inspection is conducted before the shift layer material (e.g. MoSi) is patterned so that any defects can be repaired before hand. If no inspection and repair is done at that point, the MoSi peeling defects can be severe and hard to repair later. Even it can be later repaired, the repair work impacts the quality of the finished mask. As using the methods provided above, the PSM production yield can be increased and the quality is enhanced.

The above disclosure describes many different embodiments, or examples, for implementing different features of the disclosure. Specific examples of components, and processes are described to help clarify the disclosure. These are, of course, merely examples and are not intended to limit the invention from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the invention, as set forth in the following claims.

What is claimed is:

1. A method for repairing phase shift mask comprising:
   processing a blank mask substrate by coating thereover a predetermined shift layer material, a mask pattern layer, and an energy beam resist layer sequentially;
   patterning the energy beam resist layer for defining a predetermined mask pattern;
   forming the predetermined mask pattern in the mask pattern layer based on the patterned energy-beam resist layer;
   inspecting the mask to detect at least one defect in the mask;
   repairing the predetermined mask pattern in a predetermined defect area for correcting the defect by coating a repair energy beam resist material in the predetermined defect area and patterning the coated repair energy beam resist material with a predetermined repair pattern to correct the defect and form a repaired predetermined mask pattern; and
   forming the repaired predetermined mask pattern in the shift layer material.

2. The method of claim 1 further comprising stripping the mask pattern layer from the mask.

3. The method of claim 1 wherein the inspecting further includes inspecting missing patterns in the mask pattern layer.

4. The method of claim 1 wherein the inspecting further includes inspecting shift layer material peeling defects.

5. The method of claim 1 wherein the mask pattern layer is a chromium layer.

6. The method of claim 1 wherein the shift layer material is a molybdenum silicide based material.

7. The method of claim 1 wherein the mask is an attenuated phase shift mask.

8. The method of claim 1 wherein the enemy beam resist layer contains an electron or laser beam resist material.

9. A method for repairing an attenuated phase shift mask comprising:
   processing a blank mask substrate by coating thereover a predetermined shift layer material, a mask pattern layer, and an energy beam resist layer sequentially;
   patterning the energy beam resist layer for defining a predetermined mask pattern;
   forming the predetermined mask pattern in the mask pattern layer based on the patterned energy beam resist layer;
   inspecting the mask to detect at least one missing pattern in the mask pattern layer;
   repairing the predetermined mask pattern in a predetermined defect area for correcting the missing pattern by coating a repair energy beam resist material in the predetermined defect area and patterning the coated repair energy beam resist material with a predetermined repair pattern to correct the defect and form a repaired predetermined mask pattern;
   forming the repaired predetermined mask pattern in the shift layer material; and
   stripping the mask pattern layer from the mask.

10. The method of claim 9 wherein the inspecting further includes inspecting shift layer material peeling defects.

11. The method of claim 9 wherein the mask pattern layer is a chromium layer.

12. The method of claim 9 wherein the shift layer material is a molybdenum silicide based material.

13. The method of claim 9 wherein the energy beam resist layer includes an electron or laser beam resist material.

14. The method of claim 9 further comprising removing the energy beam resist layer prior to said inspecting and wherein the inspecting comprises comparing the mask to one of a computer program and a previous mask pattern.

15. The method of claim 1 further comprising removing the energy beam resist layer prior to said inspecting and wherein the inspecting comprises comparing the mask to one of a computer program and a previous mask pattern.

16. A method for repairing an attenuated phase shift mask, the mask initially having a mask substrate coated with a predetermined shift layer material, a mask pattern layer, and a resist layer sequentially, the method comprising:
   forming a predetermined mask pattern in the mask pattern layer through the resist layer;
   inspecting the mask to detect at least one missing pattern in the predetermined mask pattern layer;
   repairing the predetermined mask pattern in a predetermined defect area for correcting the missing pattern by coating a repair resist material in the predetermined defect area and patterning the coated repair resist material with a predetermined repair pattern to correct the defect and form a repaired predetermined mask pattern;

forming the repaired predetermined mask pattern in the shift layer material; and stripping the mask pattern layer from the mask.

17. The method of claim 16 further including patterning the resist layer for defining the predetermined mask pattern before farming a predetermined mask pattern in the mask pattern layer.

18. The method of claim 16 wherein the inspecting further includes inspecting shift layer material peeling defects.

19. The method of claim 16 wherein the shift layer material is a molybdenum silicide based material.

20. The method of claim 16 further comprising removing the resist layer prior to said inspecting and wherein the inspecting comprises comparing the mask to one of a computer program and a previous mask pattern.

* * * * *

UNITED STATES PATENT AND TRADEMARK OFFICE
CERTIFICATE OF CORRECTION

PATENT NO.         : 7,348,106 B2
APPLICATION NO. : 10/841186
DATED              : March 25, 2008
INVENTOR(S)        : Hung-Chun Wang, Ming-Chih Hsieh and Han-Lin Wu It is certified that error appears in the above-identified patent and that said Letters Patent is hereby corrected as shown below:

Column 6, line 12, delete "enemy" and insert -- energy -- therefor.

Column 7, line 6, delete "farming" and insert -- forming -- therefor.

Signed and Sealed this

First Day of July, 2008

JON W. DUDAS
*Director of the United States Patent and Trademark Office*